United States Patent
Narendra et al.

(10) Patent No.: US 6,492,837 B1
(45) Date of Patent: Dec. 10, 2002

(54) DOMINO LOGIC WITH OUTPUT PREDISCHARGE

(75) Inventors: Siva G. Narendra, Beaverton, OR (US); Yibin Ye, Hillsboro, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/527,344

(22) Filed: Mar. 17, 2000

(51) Int. Cl.$^7$ .................................... H03K 19/096
(52) U.S. Cl. ............................ 326/95; 326/98; 326/93
(58) Field of Search ............................ 326/95, 93, 98

(56) References Cited

U.S. PATENT DOCUMENTS

| | | | |
|---|---|---|---|
| 4,571,510 A | | 2/1986 | Seki et al. .................... 307/449 |
| 4,697,109 A | * | 9/1987 | Honma et al. ................ 307/475 |
| 4,899,066 A | | 2/1990 | Aikawa et al. ............. 307/45.2 |
| 5,115,150 A | | 5/1992 | Ludwig ........................ 307/475 |
| 5,258,666 A | | 11/1993 | Furuki ........................... 307/449 |
| 5,453,708 A | | 9/1995 | Gupta et al. ................... 326/98 |
| 5,543,735 A | | 8/1996 | Lo ................................. 326/93 |
| 5,568,062 A | * | 10/1996 | Kaplinsky .................... 326/27 |
| 5,657,256 A | | 8/1997 | Swanson et al. ............ 364/580 |
| 5,661,675 A | | 8/1997 | Chin et al. ................... 364/768 |
| 5,671,151 A | | 9/1997 | Williams ..................... 364/489 |
| 5,731,983 A | | 3/1998 | Balakrishnan et al. ....... 364/489 |
| 5,748,012 A | | 5/1998 | Beakes et al. ................ 326/93 |
| 5,796,282 A | | 8/1998 | Sprague et al. .............. 327/210 |

(List continued on next page.)

FOREIGN PATENT DOCUMENTS

| | | | |
|---|---|---|---|
| EP | 0954101 | 3/1999 | ......... H03K/19/096 |
| JP | 59-039124 | 3/1984 | ......... H03K/19/096 |
| JP | 04-239221 | 8/1992 | ......... H03K/19/096 |

OTHER PUBLICATIONS

Xun, L., et al., "Minimizing Sensitivity to Delay Variation in High–Performance Synchronous Circuits", *Proceedings of the Design, Automation and Test in Europe Conference*, Munich, Germany, (Mar. 9–12, 1999), 643–649.

(List continued on next page.)

*Primary Examiner*—Michael Tokar
*Assistant Examiner*—Vibol Tan
(74) *Attorney, Agent, or Firm*—Schwegman, Lundberg, Woessner & Kluth, P.A.

(57) ABSTRACT

A domino logic circuit is provided. The circuit includes an n-channel clock transistor coupled between a dynamic output node and a high voltage connection, the gate of the clock transistor further coupled to receive an inverse clock signal. A first inverter has an input connected to the dynamic output node. A second inverter with an input connected to the dynamic output node comprises a static CMOS circuit stage which serves as an output receiver circuit, the output of which is the output of the domino logic circuit. An n-channel level keeper transistor is connected between the dynamic output node and the high voltage connection, and the gate of the level keeper transistor is connected to the output of the first inverter. A pull-down circuit is connected between the dynamic output node and a low-voltage connection. An output predischarge transistor is connected between the output of the static CMOS circuit and the low voltage connection, and is coupled to and controlled by a clock signal at its gate.

18 Claims, 2 Drawing Sheets

U.S. PATENT DOCUMENTS

| | | | |
|---|---|---|---|
| 5,815,005 A | * 9/1998 | Bosshart | 326/95 |
| 5,825,208 A | 10/1998 | Levy et al. | 326/98 |
| 5,831,990 A | 11/1998 | Queen et al. | 371/22.1 |
| 5,852,373 A | 12/1998 | Chu et al. | 326/98 |
| 5,886,540 A | 3/1999 | Perez | 326/93 |
| 5,889,417 A | * 3/1999 | Klass et al. | 326/98 |
| 5,892,372 A | 4/1999 | Ciraula et al. | 326/96 |
| 5,896,046 A | 4/1999 | Bjorksten et al. | 326/98 |
| 5,896,399 A | 4/1999 | Lattimore et al. | 371/21.4 |
| 5,898,330 A | 4/1999 | Klass | 327/210 |
| 5,917,355 A | 6/1999 | Klass | 327/208 |
| 5,942,917 A | * 8/1999 | Chappell et al. | 326/121 |
| 6,002,272 A | 12/1999 | Somasekhar et al. | 326/98 |
| 6,002,292 A | 12/1999 | Allen et al. | 327/379 |
| 6,049,231 A | 4/2000 | Bosshart | 326/98 |
| 6,052,008 A | 4/2000 | Chu et al. | 327/200 |
| 6,060,910 A | * 5/2000 | Inui | 326/98 |
| 6,086,619 A | 7/2000 | Hausman et al. | 703/6 |
| 6,087,855 A | 7/2000 | Frederick, Jr. et al. | 326/106 |
| 6,090,153 A | 7/2000 | Chen et al. | 716/8 |
| 6,104,212 A | 8/2000 | Curran | 326/95 |
| 6,108,805 A | 8/2000 | Rajsuman | 714/724 |
| 6,132,969 A | 10/2000 | Stoughton et al. | 435/6 |
| 6,133,759 A | * 10/2000 | Beck et al. | 326/98 |
| 6,204,696 B1 | 3/2001 | Krishnamurthy et al. | 326/98 |
| 2001/0014875 A1 | 8/2001 | Young et al. | 705/37 |

OTHER PUBLICATIONS

Bryant, R.E., "Graph–Based Algorithms for Boolean Function Manipulation", *IEEE Transactions on Computers*, C–35 (8), pp. 677–691, (1986).

Chakradhar, S.T., et al., "An Exact Algorithm for Selecting Partial Scan Flip–Flops", *Proceedings of the 31st Design Automation Conference*, San Diego, California, pp. 81–86, (1994).

Chakravarty, S., "On the Complexity of Using BDDs for the Synthesis and Analysis of Boolean Circuits", *27th Annual Allerton Conference on Communication, Control, and Computing*, Allerton House, Monticello, Illinois, pp. 730–739, (1989).

Patra, P., et al., "Automated Phase Assignment for the Synthesis of Low Power Domino Circuits", *Proceedings of the 36th ACM/IEEE Conference on Design Automation*, pp. 379–384, (1999).

Puri, et al., "Logic Optimization by Output Phase Assignment in Dynamic Logic Synthesis", *International Conference on Computer Aided Design*, 7 p., (1996).

Thompson, S., et al., "Dual Threshold Voltages and Substrates Bias: Keys to High Performance, Low Power, 0.1 um Logic Designs", *1997 Symposium on VLSI Technology Digest of Technical Papers*, pp. 69–70, (1997).

* cited by examiner

DOMINO LOGIC WITH OUTPUT PREDISCHARGE

FIELD OF THE INVENTION

The invention relates generally to semiconductor logic devices, and more specifically to domino logic circuitry having a novel static output predischarge gate.

BACKGROUND OF THE INVENTION

Semiconductor operational frequencies are ever increasing, requiring circuitry and processes that support these faster clock rates. Domino circuits have been used in such circuits to speed processing, due to the way in which a domino logic circuit handles data. A typical domino logic circuit receives data on a first transition of a clock, and couples a logically derived signal to external circuitry on a next transition of the clock.

A conventional domino circuit includes dynamic circuitry coupled to static gate circuitry. The dynamic circuitry precharges an input of the static circuitry when a clock signal is low, and couples an input data signal to the static circuitry when the clock signal is high. The dynamic circuitry often is n-type metal oxide semiconductor (NMOS) pull-down circuitry, that is operable to pull down the level of a relatively weakly held pre-charged circuit node. The node then provides a stable output to static CMOS circuitry until the next reset phase.

But, the speed of such logic is limited by the time it takes to pre-charge the dynamic circuit node that provides the data signal to the static CMOS circuitry, and by the time it takes to pull down the weakly-held precharged node voltage to provide a low signal level to the static CMOS circuitry. For these reasons and others that will be apparent to those skilled in the art upon reading and understanding this specification, a need exists for a domino logic circuit that reduces the time required to change the state of the static CMOS stage of a domino logic circuit to provide a faster overall signal propagation speed.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

Because domino logic circuits are typically employed in high-speed digital logic circuits, a need exists for domino logic circuits that provide for the fastest operational speeds as can be practically achieved. Such desired increases in speed can be realized by modifying a domino logic circuit to change states more quickly, such as by altering threshold points or otherwise decreasing the voltage swing needed to change states.

The present invention provides an improved domino logic circuit incorporating a static output gate predischarge, enabling greater static gate switching threshold skew resulting in faster static gate stage operation of the domino logic circuit. The present invention therefore enables faster overall domino logic circuit operation than traditional domino logic using the same fabrication process, and therefore offers a desirable improvement over the prior art.

Figure 1:
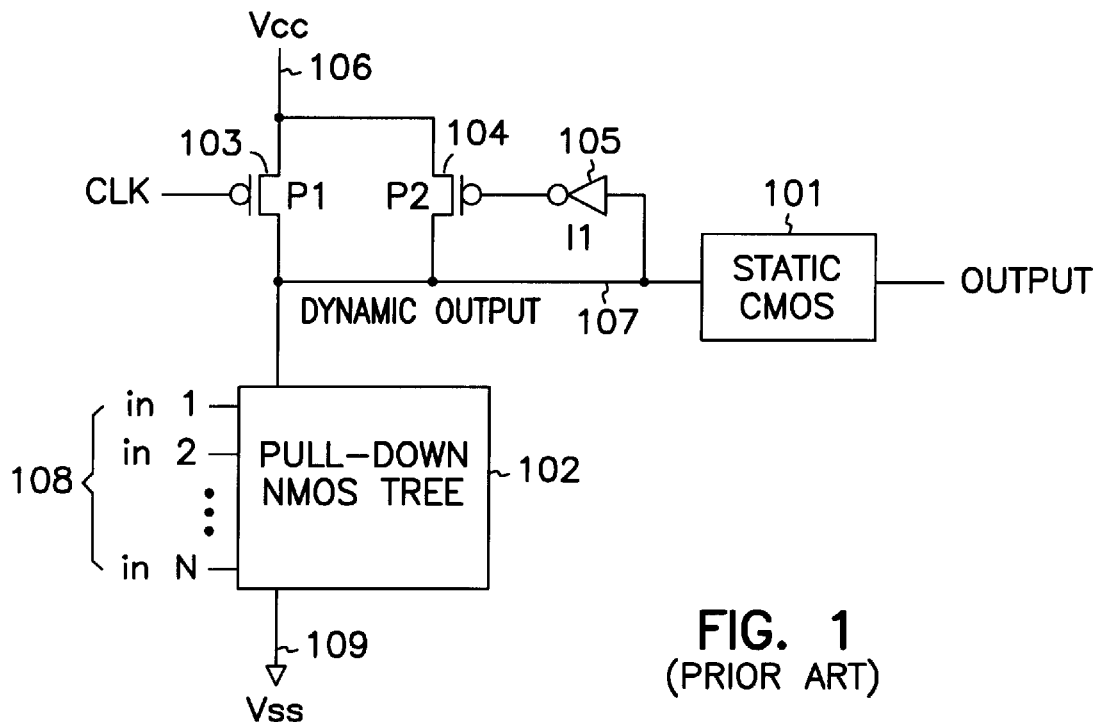
FIG. 1 shows a domino logic circuit, consistent with the prior art.

FIG. 1 illustrates a typical prior art domino logic circuit. The circuit consists essentially of three stages, including a static complementary metal-oxide semiconductor (CMOS) circuit 101, a dynamic precharge circuit, and a pull-down n-channel metal oxide semiconductor (NMOS) circuit 102. The dynamic precharge circuit typically consists of a p-channel transistor 103 that is coupled to a clock signal at its gate, and a second p-channel transistor 104 that is coupled to an inverter 105 output at its gate. Both p-channel transistors 103 and 104 are connected between a high voltage connection 106 and a dynamic output node 107, and the input of the inverter 105 is further connected to the dynamic output node 107. The dynamic output node is connected to the static CMOS circuit 101, and to the pull-down NMOS tree 102. The pull down NMOS tree 102 is further connected to one or more inputs 1 through n shown at 108, and to a low voltage connection 109. In some embodiments, p-channel transistor 104 has a relatively small channel width or other feature to reduce the current conducted by the transistor.

In operation, the p-channel transistor 103 conducts when the clock signal is low, charging dynamic output node 107 to approximately the voltage level of the high voltage connection 106. This stage is known as the precharge phase or reset phase, because the dynamic output node is charged to the voltage present at 106. When the clock signal goes high, the p-channel transistor 103 no longer conducts, and the voltage level at the dynamic output node 107 is maintained high by p-channel transistor 104.

Transistor 104 and inverter 105 form a level keeper portion of the circuit, and function to weakly maintain the present high or low voltage state of the dynamic output node 107 when the clock signal is high. Because the dynamic output node is at high voltage when the clock transitions from low to high, the dynamic output node high voltage signal is inverted by the inverter and turns the p-channel transistor 104 on, maintaining a connection between the high voltage connection 106 and the dynamic output node 107. P-channel transistor 104 is intentionally designed to be somewhat weak, or to have a low current when on, so that the dynamic output node can be driven to a low voltage level despite the level keeper.

The pull-down NMOS tree 102 implements the logic portion of the circuit, and is connected between the dynamic output node and the low voltage connection 109. The pull-down NMOS tree either connects or does not connect the dynamic output node to ground, depending on the desired logical output. If the pull-down NMOS tree is turned on and conducts between the low voltage connection 109 and the dynamic output node 107, the conduction to a low voltage level overcomes the high voltage connection via p-channel transistor 104 of the level keeper, forcing the dynamic output node to a low voltage state. The level keeper circuit then turns transistor 104 off, leaving the dynamic output node at a low voltage level.

After sufficient time has passed for the dynamic output node to change states from a high voltage level to a low voltage level if necessary, the dynamic output node signal provides a logical output signal representing the logic of the pull-down NMOS tree, and is input to a static CMOS circuit 101. The static CMOS circuit then provides a high or low voltage output, based on whether the dynamic output node 107 has a voltage level higher or lower than the threshold point of the static CMOS circuit. Adjustment or skew of the threshold point of the static CMOS circuit to a higher voltage level may be employed to reduce the time needed for the dynamic output node to cross the threshold point, substantially increasing the speed of the domino logic stage.

The time needed for the static CMOS circuit to change state after the clock signal transitions high is dependent on the time needed to pull the dynamic output node 107 down from its high voltage level to a voltage level below the threshold point Vt of the static CMOS circuit. In this circuit, the voltage swing must therefore be Vcc−Vt, or the high voltage connection voltage level minus the threshold voltage of the static CMOS circuit. The voltage threshold Vt is typically Vcc/2, meaning a voltage swing of one-half Vcc is necessary to change states. It is desirable in some embodiments to set the threshold point Vt higher than Vcc/2, or to skew the threshold point. This permits the voltage of the dynamic output node 107 to change state from Vcc to Vcc−Vt more rapidly, and so provides faster operation. Such a circuit results in faster switching of the state of the dynamic output node, and faster CMOS static gate 101 reaction to the change in the dynamic output node state.

Figure 2:
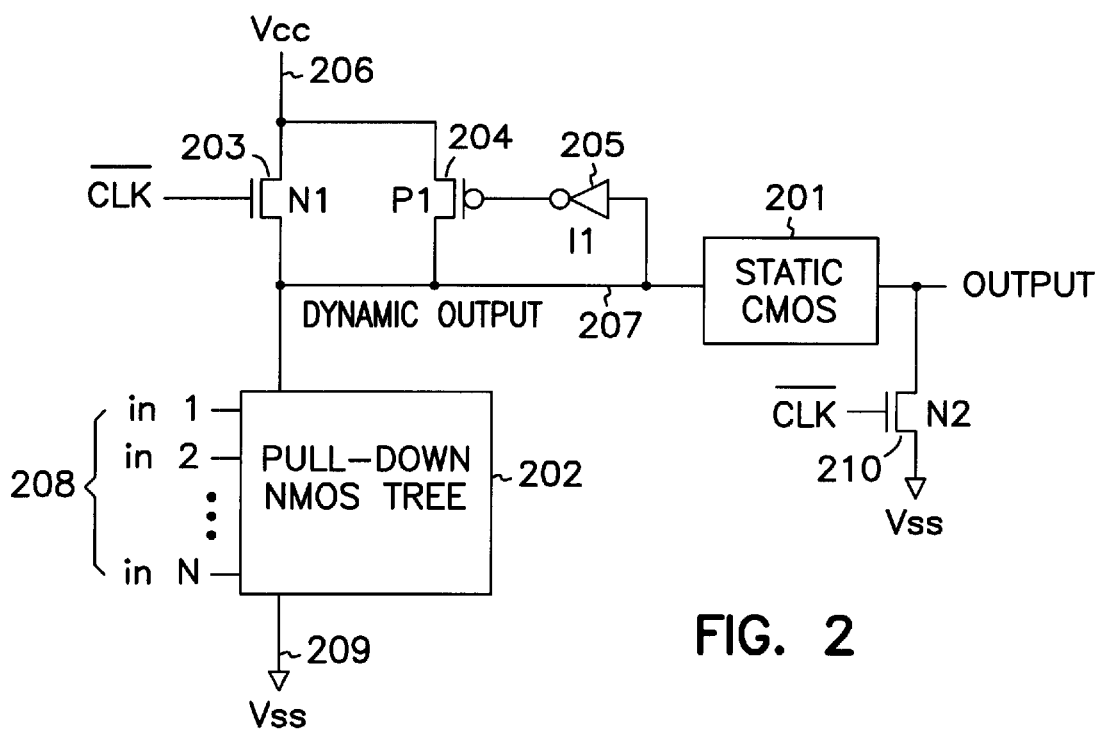
FIG. 2 shows an NMOS static gate output predischarge domino logic circuit consistent with an embodiment of the present invention.

FIG. 2 illustrates one embodiment of the invention, which incorporates an output predischarge NMOS transistor 210 which is employed to assist in changing the output value of the static CMOS circuit 201. The static CMOS circuit is connected to the pull-down NMOS tree 202 by dynamic output node 207. The dynamic precharge circuit of the example embodiment consists of an n-channel transistor 203 that is coupled to an inverted clock signal at its gate, and a p-channel transistor 204 that is coupled to an inverter 205 output at its gate. Both n-channel transistor 203 and p-channel transistor 204 are connected between a high voltage connection 206 and the dynamic output node 207, and the input of the inverter 205 is further connected to the dynamic output node 207. The dynamic output node is connected to the static CMOS circuit 201, and to the pull-down NMOS tree 202. The pull down NMOS tree 202 is further connected to one or more inputs 1 through n shown at 208, and to a low voltage connection 209. In some embodiments, p-channel transistor 204 has a relatively small channel width or other feature to reduce the current conducted by the transistor. The n-channel output predischarge n-channel transistor 210 is connected between the output of the static CMOS circuit 201 and a low voltage connection 209. The gate of the output predischarge transistor 210 is connected to an inverted clock signal, such that the transistor conducts during the precharge or reset phase.

The example circuit illustrated in FIG. 2 differs from the prior art in that it includes output predischarge n-channel transistor 210, which pulls down the output of the static CMOS circuit 201 during the precharge phase. This enables faster reset of the static CMOS output and thereby allows greater skew in the static CMOS circuit 201. This will be explained in more detail with respect to the embodiment of the invention illustrated in FIG. 3.

In some embodiments, n-channel transistor 203 is used in place of the p-channel transistor 103 as in FIG. 1 because n-channel devices are typically capable of faster operation. For the circuit of FIG. 2, n-channel transistor 203 pulls the voltage at the dynamic output node 207 up to Vcc−Vt relatively quickly, and the level keeper p-channel transistor 204 then pulls the node 207 up to the full value of Vcc. It is important to note that the skew or switching threshold of inverter 205 must be such that the n-channel transistor 203 raises the dynamic output node to a sufficient level to cause the inverter to change state and activate the level keeper transistor.

Figure 3:
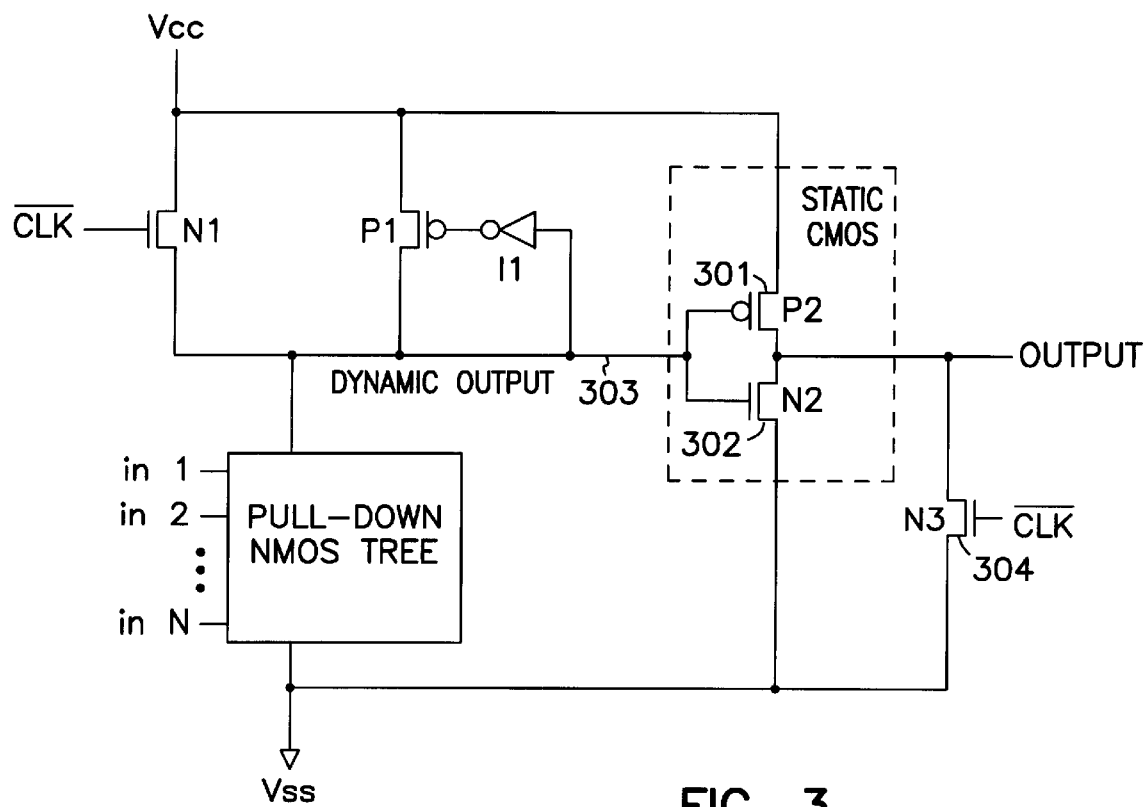
FIG. 3 shows an NMOS static inverter gate output predischarge domino logic circuit consistent with an embodiment of the present invention.

FIG. 3 illustrates an embodiment of the invention in which the static CMOS circuit is an inverter comprising p-channel transistor 301 and n-channel transistor 302. The gate of each of transistors 301 and 302 is connected to dynamic output node 303, and the output of the static CMOS circuit is connected to output predischarge n-channel transistor 304.

Because it is desirable to skew the static CMOS circuit to provide faster switching, the n-channel transistor 302 is often smaller than the p-channel transistor 301. This raises the value of Vt, making a voltage change from Vcc to Vcc−Vt faster. But, the resulting smaller n-channel transistor 302 is not capable of changing the output value as fast as is desirable due to its relatively small size, which has traditionally limited the ability to skew such a circuit. It is desired to reduce the time necessary to change the state of the static CMOS circuit output because doing so results in a faster reset and faster total circuit throughput.

Addition of the output predischarge n-channel transistor 304 allows a smaller n-channel transistor 302 and therefore allows higher skew by assisting the n-channel transistor 302 in pulling down the value of the output when the circuit is in the precharge phase. The output predischarge transistor 304 of the example circuit of FIG. 3 is also controlled by the clock via an inverted clock signal connected to the gate. This enables yet faster operation because the clock changes faster than the dynamic output node which controls the inverter transistors 301 and 302. The n-channel output predischarge transistor 304 is also switched off in the evaluation phase, and therefore does not affect the skew of the static CMOS circuit.

In other embodiments, a combination of transistors or a single p-channel transistor may be used to provide output predischarge, and are to be considered within the scope of the invention. Also, it is anticipated that a variety of static CMOS circuit embodiments may be used in various embodiments, all of which may benefit from greater skew by use of the output predischarge transistor of the present invention. Further, the static CMOS circuit may in alternate embodiments of the invention be replaced by any output receiver circuit operable to receive and output a logic signal from the dynamic output node, including dynamic output receiver circuitry. The output predischarge transistor in various embodiments may be controlled by the clock or by the dynamic output node, or by any other node providing an appropriate signal indicating that the circuit is in a reset or precharge phase. Use of the output predischarge transistor in any such embodiment allows greater skew in the static CMOS circuit, and provides faster pull-down of the output because the of the increased conduction. In some further embodiments, the output predischarge transistor is controlled by the clock which changes state faster than the dynamic output node, thereby providing even faster operation.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

We claim:

1. A circuit, comprising:
    an n-channel clock transistor coupled between a dynamic output node and a first supply voltage, a gate of the clock transistor coupled to receive a clock signal;
    an inverter, an input of the inverter connected to the dynamic output node;
    a level keeper transistor coupled between the dynamic output node and the first supply voltage, the gate of the level keeper transistor coupled to the output of the inverter;
    a pull-down circuit connected between the dynamic output node and a second supply voltage;
    an output receiver circuit, an input of the output receiver circuit connected to the dynamic output node; and
    an output predischarge transistor coupled between an output of the output receiver circuit and the second supply voltage, the gate of the output predischarge transistor connected to receive the clock signal.

2. The circuit of claim 1, wherein the clock signal coupled to the gate of the clock transistor and to the gate of the output predischarge transistor is an inverted clock signal.

3. The circuit of claim 1, wherein the pull-down circuit is a pull-down NMOS tree.

4. The circuit of claim 1, wherein the level keeper is a p-channel transistor.

5. The circuit of claim 1, wherein the output receiver circuit comprises a static CMOS circuit.

6. The circuit of claim 5, wherein the static CMOS circuit comprises a second inverter which is skewed to have a high threshold voltage.

7. An integrated circuit, comprising:
    a first input connection for receiving a clock signal;
    a second input connection for receiving an input data signal;
    a domino logic circuit coupled to receive the input clock signal and the data signal, the clock signal received in an n-channel clock transistor, the domino logic circuit comprising an output predischarge transistor coupled between an output of a output receiver circuit and a first voltage supply, the gate of the output predischarge transistor connected to receive the clock signal.

8. The integrated circuit of claim 7, wherein the gate of the n-channel clock transistor is coupled to receive an inverse clock signal.

9. The integrated circuit of claim 7, wherein the domino logic circuit further comprises a pull-down circuit coupled between a dynamic output node and the first voltage supply, such that the pull-down circuit is coupled to receive an input data signal.

10. The integrated circuit of claim 9, wherein the pull-down circuit is a pull-down NMOS tree.

11. The integrated circuit of claim 7, wherein the output receiver circuit comprises a static CMOS circuit.

12. The integrated circuit of claim 11, wherein the static CMOS circuit comprises a second inverter that is skewed to have a high threshold voltage.

13. A processor integrated circuit, comprising a domino logic circuit coupled to receive an input clock signal and a data signal, the domino logic circuit comprising an output predischarge transistor coupled between an output of an output receiver circuit and a first voltage supply, the gate of the output predischarge transistor connected to receive the input clock signal, and the input clock signal received in an n-channel clock transistor.

14. The processor integrated circuit of claim 13, wherein the domino logic circuit further comprises an n-channel transistor coupled between a second voltage supply and a dynamic output node, the gate of the n-channel transistor coupled to receive an inverse clock signal.

15. A method of operating a domino logic circuit, comprising:
    receiving a clock signal via a first transistor coupled between a first supply voltage and a dynamic output node, where the first transistor is an n-channel clock transistor;
    receiving the clock signal via an output predischarge transistor coupled between an output of a static CMOS circuit and a second supply voltage;
    charging the dynamic output node of the domino logic circuit via the first transistor when the clock signal causes the first transistor to turn on;
    pulling the voltage present at the output of the static CMOS circuit to approximately the voltage level of the second supply voltage when the clock signal causes the output predischarge transistor to turn on;
    receiving an input data signal via a pull-down circuit connected between the dynamic output node and the second supply voltage; and
    evaluating the input data signal by selectively coupling the dynamic output node to the second voltage source in response to the input data signal when the clock signal causes the first transistor to turn off.

16. The method of claim 15, wherein the domino logic circuit comprises a part of a processor integrated circuit.

17. A circuit, comprising:
    an n-channel clock transistor coupled between a dynamic output node and a first supply voltage, a gate of the clock transistor coupled to receive a clock signal;
    an inverter, an input of the inverter connected to the dynamic output node;
    a p-channel level keeper transistor coupled between the dynamic output node and the first supply voltage, the gate of the level keeper transistor coupled to the output of the inverter;
    an NMOS tree pull-down circuit connected between the dynamic output node and a second supply voltage;
    a static CMOS circuit, an input of the static CMOS circuit connected to the dynamic output node; and
    an n-channel output predischarge transistor coupled between an output of the static CMOS circuit and the second supply voltage, the gate of the output predischarge transistor connected to receive the clock signal.

18. The circuit of claim 17, wherein the static CMOS circuit is an inverter which is skewed to have a high threshold voltage.

* * * * *

UNITED STATES PATENT AND TRADEMARK OFFICE
CERTIFICATE OF CORRECTION

PATENT NO.    : 6,492,837 B1                                              Page 1 of 1
DATED         : December 10, 2002
INVENTOR(S)   : Vivek K. De, Siva G. Narendra and Yibin Ye It is certified that error appears in the above-identified patent and that said Letters Patent is hereby corrected as shown below:

<u>Title page,</u>
Item [56], U.S. PATENT DOCUMENTS, delete "371/21.4" and insert
-- 371/21.1 -- therefor.
Insert the following under "5,942,917":

-- US-5986399    04/20/1999    Lattimore, G.M., et al.    371    21.4 --

<u>Column 4,</u>
Line 61, delete "the" after "because".

<u>Column 5,</u>
Line 48, delete "a" before "output" and insert -- an -- therefor.

Signed and Sealed this

Twenty-ninth Day of July, 2003

JAMES E. ROGAN
*Director of the United States Patent and Trademark Office*